United States Patent [19]

Ehni et al.

[11] Patent Number: 4,789,793
[45] Date of Patent: Dec. 6, 1988

[54] INTEGRATED FET CIRCUIT TO REDUCE SWITCHING NOISE

[75] Inventors: George J. Ehni, Dallas; Jy-Der Tai, Plano; Edison H. Chiu, Richardson, all of Tex.; Thomas A. Carroll, Boulder, Colo.

[73] Assignee: Texas Instruments Incorporated, Dallas, Tex.

[21] Appl. No.: 18,871

[22] Filed: Feb. 24, 1987

[51] Int. Cl.⁴ .................. H03K 17/687; H01L 5/13
[52] U.S. Cl. .................. 307/303; 307/579; 307/594; 307/596
[58] Field of Search .......... 307/303, 596–605, 307/571–585; 357/13

[56] References Cited

U.S. PATENT DOCUMENTS

| | | | |
|---|---|---|---|
| 3,544,962 | 12/1970 | Thompson | 307/596 |
| 3,851,185 | 11/1974 | Hatsukano et al. | 307/470 |
| 4,103,188 | 7/1978 | Morton | 307/300 |
| 4,335,405 | 6/1982 | Sakano et al. | 357/30 |
| 4,509,067 | 5/1985 | Minami et al. | 357/13 |

FOREIGN PATENT DOCUMENTS

163532 8/1985 Japan .

Primary Examiner—Stanley D. Miller
Assistant Examiner—B. P. Davis
Attorney, Agent, or Firm—Larry C. Schroeder; James T. Comfort; Melvin Sharp

[57] ABSTRACT

A CMOS output pair provides rapid switching speed while avoiding excessive noise levels developed across the power supply parasitic inductance. Both the P-channel and N-channel transistors of the output pair actually comprise a plurality of sub-transistors with their source to drain current paths connected in parallel. As a result of novel RC coupling of a switching signal from gate to gate of either of the plurality of sub-transistors, the sub-transistors are caused to turn on sequentially. Since none of the sub-transistors is capable of supporting the current that must be carried by the totality of sub-transistors making up either the P-channel or N-channel transistor, the increments of current as each sub-transistor turns on are small relative to the total.

23 Claims, 2 Drawing Sheets

INTEGRATED FET CIRCUIT TO REDUCE SWITCHING NOISE

TECHNICAL FIELD OF THE INVENTION

This invention pertains in general to integrated circuits, and more particularly relates to reducing output noise of digital integrated circuits.

RELATED APPLICATIONS

"Integrated Circuit Distributed Geometry To Reduce Circuit Noise", by Steven Edward Marum, James Craig Spurlin, Dale Philip Stein, and Sam Max Weaver, Ser. No. 902,267, filed Aug. 29, 1986 now U.S. Pat. No. 4,725,747, Feb. 16, 1988 (Attorney Docket TI-12067)

"Integrated Circuit to Reduce Switching Noise", by Dale Philip Stein, Ser. No. 901,919, filed Aug. 29, 1986 (Attorney Docket TI-12252)

"Integrated Circuit to Reduce Switching Noise", by George John Ehni, Ser. No. 901,918, filed Aug. 29, 1986 (Attorney Docket TI-11950).

BACKGROUND OF THE INVENTION

Advancement in integrated circuit technology had lead to vast improvements in the speed of integrated circuits, i.e. the time in which the output of a circuit reacts in response to a new input. Increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents has created serious problems. The package which holds an integrated circuit device has metallic leads which allow interconnection of the device on a circuit board. Each lead has a small inductance associated with it. The leads are connected to the integrated circuit using bonding wire, which also has an inductance associated with it. Voltage is related to inductance and the time rate of change of current by the equation $E = L \cdot dI/dT$, where L is the measure of inductance, and dI/dT is the change in current with respect to time. The abrupt transition of output currents creates a large change of current at the ground and power supply leads and in the bonding wire, resulting in ground and power supply voltage spikes. These voltage spikes affect the output voltages of the device, and cause output ringing, ground bounce, and false signals.

Techniques have been heretofore developed which attempt to alleviate this problem by reducing the amount of inductance present in the leads. One method provides multiple power supply and ground leads in order to reduce the inductance (L) that generates the voltage spikes. However, the reduction in inductance is often insufficient to eliminate voltage spikes at the output of many devices, and may necessitate using a larger package to carry the same integrated circuit.

Another method has attempted to reduce the effects of the voltage spikes by bifurcating the surge of current through the lead inductances of the package. The large pull-down transistor in the standard CMOS buffer is split into two devices separated by a resistor. The resistor delays the turn-on of the second device so that the circuit produces two smaller current spikes rather than one large current spike. While somewhat slowing the edge of the output current transition, this circuit is often insufficient to bring the dI/dT term to a value which will reduce voltage spikes at the power and ground leads.

In the integrated circuit devices shown in the previously mentioned related applications, a substrate has a plurality of semiconductor areas forming the sources and drains of a plurality of transistor regions. A continuous serpentine gate, typically made of polysilicon, extends from one to another of these regions to provide the gate conductor of each. This serpentine gate has a predetermined resistance. A signal applied to a first end region of the gate propagates along the length of the gate during a predetermined time interval. As this signal propagates along the gate, it turns on the transistor regions in sequence. As a result, the single distributed transistor which is comprised of the plurality of transistor regions, turns on incrementally thereby limiting the rate of change of output current with respect to time. Various structures are disclosed for causing a temporary voltage drop along the continuous gate to further limit the rate of change of the output current with respect to time. While the described structures have proven to be very useful in certain applications, there are cases where the amount of delay available with typical polysilicon continuous gates is not sufficient to adequately limit noise resulting from rapid change of current. This is particularly the case with large scale integration (LSI) applications.

From the foregoing, it may be seen that a need has arisen for a technique which produces a smooth change of output current with respect to time in response to switching output voltage states, in order to reduce or eliminate voltage spikes. Furthermore, a need has arisen for circuitry capable of protecting against false outputs without substantially increasing the number of devices needed to implement the circuitry.

SUMMARY OF THE INVENTION

In accordance with the present invention, an integrated circuit is provided which substantially eliminates or reduces disadvantages and problems associated with switching noise in prior high speed integrated circuits.

In accordance with another aspect to this invention there is disclosed a transistor structure which performs the function of an output switch comprised of the cascade of a P-channel and an N-channel transistor. Each of these transistors is actually a distributed transistor comprised of a series of sub-transistors which are turned on sequentially so as to avoid an excessively large dI/dT value. In each case the sequential turn-on is accomplished by virtue of a plurality of resistance elements each of which serves to couple the gate of one sub-transistor to the gate of the next sub-transistor in the sequence. Each such resistance element, in combination with the gate-to-substrate capacitance of the sub-transistor supplied by the resistance element, results in a time delay as the turn-on voltage propagates through the series of transistors. In the case of the P-channel distributed transistor, each resistance element comprises a coupling transistor. In the case of the N-channel distributed transistor, each resistance element comprises part of an N-well formed in the substrate. In either case, the amount of resistance that can be realized between sequential sub-transistors is much greater than can be achieved with the previously mentioned continuous polysilicon gate. As a result, particularly in the aforementioned LSI applications, the invention provides marked improvement in the noise performance of the circuits and reduction in the size of the circuits that would otherwise be necessary to achieve the same performance.

In the case of the N-channel distributed transistor, additional control of the turn on current is realized by virtue of a conducting device coupling the last gate of the series of sub-transistors to ground. This results in current flow through the series of coupling resistors, and a consequent voltage drop along the series. Consequently, at the outset of the switching operation, sub-transistors near the end of the chain have relatively small currents flowing through them. Over a predetermined time interval, the amount of current through the conducting device at the end of the transistor chain is reduced, thereby increasing the amount of current which the sub-transistors can conduct. The gradual increase of conductivity of the sub-transistors reduces the generation of output noise by limiting the rate of change of output current with respect to time.

It is an object of the invention to provide an integrated circuit structure comprising:

a substrate having semiconductor areas forming a plurality of sub-transistors, each of said sub-transistors having a discrete gate, and at least one pair of said sub-transistors having the gates of the two sub-transistors of the pair coupled through the source-to-drain current path of a coupling transistor to form a series circuit so that a gate signal applied to the gate of a first sub-transistor of said series circuit propagates to the gate of a subsequent sub-transistor in said circuit in a predetermined time interval, the propagation of said gate signal along said series circuit causing sequential conduction of ones of said sub-transistors.

It is an additional object of the invention to provide an integrated circuit structure comprising:

a substrate having semiconductor areas forming a plurality of sub-transistors, each of said sub-transistors having a discrete gate, and resistance means comprising a doped region near the surface of said substrate, said resistance means serving to couple the gates of at least one pair of said sub-transistors in a series circuit so that a gate signal applied to the gate of a first-transistor of said series circuit propagates to the gates of consecutive sub-transistors in said circuit in a predetermined time interval, the propagation of said gate signal along said series circuit causing sequential conduction of ones of said sub-transistors.

It is another object of the invention to provide an integrated circuit structure comprising:

a substrate having semiconductor surface areas forming a plurality of sub-transistors, each of said sub-transistors having a discrete gate, resistance means intermediate pairs of said sub-transistors to couple the gates of at least some of said sub-transistors in a series circuit so that a gate signal applied to the gate of a first sub-transistor of said series circuit propogates to the gates of consecutive sub-transistors in said circuit in a predetermined time interval, the propagation of said gate signal along said series circuit causing conduction of ones of said sub-transistors; and a conducting device connected to a point in said series circuit remote from the gate of said first sub-transistor to allow a transient current to pass from said gate of said first sub-transistor through at least a portion of said resistance means to cause a voltage drop across said portion, said voltage drop reducing the amount of current conducted by ones of said transistors.

It is yet a further object of the invention to provide an integrated circuit structure comprising:

a substrate having semiconductor areas forming a first plurality of sub-transistors, each of said sub-transistors having a discrete gate, and a plurality of coupling transistors, the source to drain current path of each of said coupling transistors being connected between the gates of two of said first plurality of sub-transistors so that a turn-on gate signal applied to the first gate of said first plurality of sub-transistors is propagated over a period of time by said coupling transistors to the gates of others of said first plurality of sub-transistors, ones of said first plurality of sub-transistors turning on at different times to prevent the large gate of change in power supply current that would be required if all the sub-transistors of said first plurality turned on at the same time.

BRIEF DESCRIPTION OF THE DRAWINGS

For a more complete understanding of the present invention and the advantages thereof, reference is now made to the following description in conjunction with the accompanying Drawings in which.

DETAILED DESCRIPTION OF THE INVENTION

Figure 1:
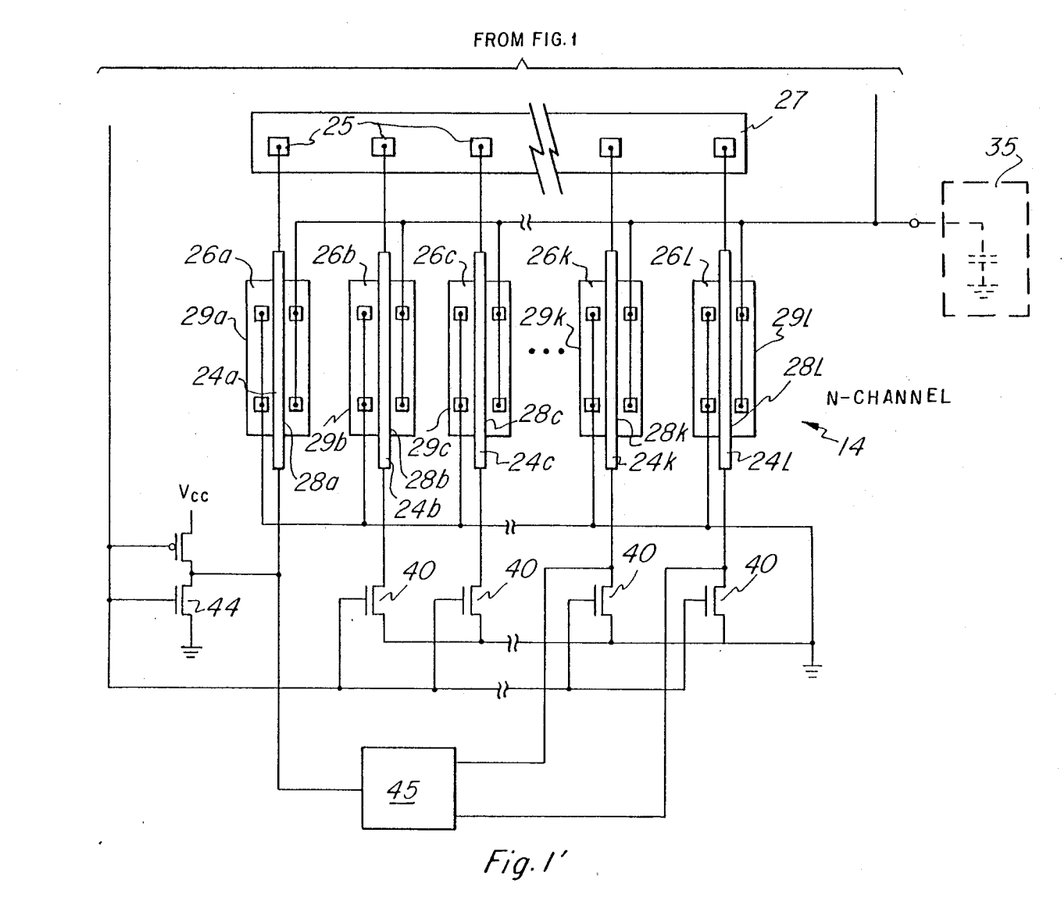
FIG. 1 illustrates a layout of a circuit implemented in accordance with the present invention in a CMOS chip to reduce abrupt output current transitions with respect to time.

The preferred embodiment of the present invention is best understood by referring to FIG. 1 of the Drawings, like numerals being used for like and corresponding parts of the various Drawings. FIG. 1 illustrates a circuit used to reduce the sharp current transitions in a CMOS device. An output CMOS transistor pair, generally referred to by the reference number 10, includes a P-channel transistor 12 and an N-channel transistor 14.

The P-channel transistor 12 is comprised of a plurality of P-channel sub-transistors formed in an N-well 15 at the surface of the substrate and with their source-drain paths connected in parallel. These sub-transistors are identified by brackets 18a–l. While there are twelve such sub-transistors in the preferred embodiment, only five are shown in the interrupted view of FIG. 1. These sub-transistors include sources 18a–g, drains 20a–f, and gates 16a–l. The gates of the sub-transistors so formed are connected in a series relationship by means of a plurality of N-channel coupling transistors, there being one such N-channel coupling transistor between each consecutive pair of gates in the series of P-channel transistors. The coupling transistors, identified by brackets 17a–k, have gates shown at 19a–k. Doped regions 23a–l form the sources and drains of the coupling transistors, 23a being the source of transistor 17a, 23b being the drain of transistor 17a and the source of transistor 17b, 23c being the drain of transistor 17b and the source of transistor 17c, etc. Thus the source and drain of N-channel coupling transistor 17a connect gates 16a and 16b of P-channel sub-transistors 21a and 21b respectively.

Coupling transistor 17b connects the gates of the second and third P-channel sub-transistors, etc. The term "sub-transistor" is used herein, not to signify that these devices are not true and complete transistors, but rather to signify that, collectively, a set of sub-transistors serves to perform the function of a single transistor, but with the advantages made possible by the invention disclosed and claimed herein.

A plurality of metal contacts, as illustrated generally at 22 are formed on the various source and drain regions for the purpose of facilitating electrical connections between the various elements. The sources 18a–g of the P-channel sub-transistors are connected to Vcc (the positive power supply lead) generally held at plus five volts. Similarly, the gates 19a–k of coupling transistors 17a–k are connected to Vcc. The P-channel drains 20a–f are connected by output 34 to a capacitor 35 shown in phantom to represent the capacitance of the circuitry connected to the output.

A plurality of P-channel pull-up transistors 36 are connected at their gates to the input signal as well. The drain of each of the pull-up transistors is connected to one of gates 16b–l of P-channel transistors 21b–l. The source of each pull-up transistor is connected to Vcc. In this specification and claims, the term "turn-off transistor" will be used synonymously with either the term "pull-up transistor" or "pull-down transistor", the latter being discussed in more detail below.

The input signal 37 is coupled to gate 16a of P-channel sub-transistor 21a by means of an inverter 38. Inverter 38 is comprised of the cascade connection of a P-channel and an N-channel transistor with the source of the P-channel transistor connected to Vcc and the source of the N-channel transistor connected to ground. The gates of both transistors are connected to input 37 while the inverter output is the common point between the P-channel drain and the N-channel drain. There is little current drawn from this inverter so large switching transients do not occur.

N-channel transistor 14 is comprised of a plurality of N-channel sub-transistors 29a–l having their source-drain paths connected in parallel. These N-channel sub-transistors include sources 26a–l, drains 28a–l, and gates 24a–l. Again for purposes of clarity, only five of the N-channel transistors are shown, there being twelve in the preferred embodiment. The drains 28a–l of these N-channel sub-transistors are also connected by output 34 to capacitor 35, while sources 26a–l are connected to the ground terminal of the device.

In accordance with the practice of the invention, an N-well 27 is formed at the surface of the substrate to provide resistors for coupling the consecutive gates of the N-channel transistors. Each consecutive gate 24a–l is connected to a consecutive one of taps 25 located along the surface of N-well 27, whereby the material of the well intermediate adjacent taps comprises a resistor for coupling the gates of adjacent N-channel sub-transistors. In the preferred embodiment using techniques that are well known in the art, the configuration of N-well 27, the doping concentration, and the location of the taps are selected to result in a resistance value of 1.5K ohms between each pair of consecutive gates. In this specification and claims, the term "resistance means" is intended to refer to, inter alia, this N-well configuration of resistors as well as the coupling transistors which comprise part of P-channel transistor 12 as discussed above, but the term is not intended to refer to the "shared gate" or "elongated gate" disclosed in the aforementioned related applications.

A plurality of N-channel pull-down transistors are connected at their gates to the input signal. The source of each of the pull-down transistors is connected to ground while the drain of each of the pull-down transistors is connected to one of the gates 24b–l of N-channel sub-transistors 29b–l. The input signal 37 is connected to gate 24a of N-channel sub-transistor 29a by means of an inverter 44. Inverter 44 is comprised of the cascade connection of a P-channel and an N-channel transistor with the source of the P-channel transistor connected to Vcc and the source of the N-channel transistor connected to ground. The gates of both transistors are connected to input 37 while the inverter output is the common point between the P-channel drain and the N-channel drain. As in the case of inverter 38, there is little current drawn from this inverter so large switching transients do not occur. The inverter output is connected to gate 24a.

A voltage controlling circuit 45 is connected at one terminal to the output of inverter 44, another terminal to gate 24k, and a third terminal to gate 24l. The specific circuitry and operation of circuit 45 will be subsequently described in connection with FIG. 3.

While a specific connection has been disclosed for inverters 38 and 44, there is an equally acceptable alternate arrangement. Thus the output of inverter 38 could be used to drive the gates of P-channel pull-up transistors 36, with input 37 being directly connected to gate 16a of P-channel sub-transistor 21a. In this case the output of inverter 44 would be connected to the gates of N-channel pull-down transistors 40, and input 37 would be connected directly to gate 24a of N-channel sub-transistor 29a as well as to one terminal of voltage controlling circuit 45. If this alternate arrangement of inverters is used, the response of the circuit to a given polarity of input signal 37 will be the opposite of what is described in the operational discussion below.

Figure 2:
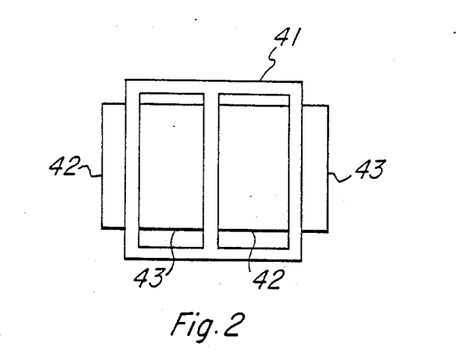
FIG. 2 illustrates a transistor configuration for use in connection with the present invention.

For ease of illustration, each of the parallel connected P-channel sub-transistors 21a–l has been shown with the same geometrical configuration, as have each of parallel connected N-channel sub-transistors 29a–l. In actuality there are differences in the configurations in the preferred embodiment. Each of the first four P-channel sub-transistors 21a–d has the same gate area and is configured approximately as illustrated. Such is also the case for the first four N-channel sub-transistors 29a–d. In each case, however, the remaining eight sub-transistors 21e–l in the P-channel case and 29e–l in the N-channel case have materially larger gate areas than do the first four in each parallel combination. The general configuration of one of the sub-transistors having these larger gate areas is illustrated in FIG. 2. This surface view shows a window-frame shaped gate 41, source regions 42, and drain regions 43. When connected to the other elements of the circuit, the two source regions are connected together as are the two drain regions.

The following shows the relative sizes of the various transistors in the preferred embodiment of the invention.

TABLE OF SIZES
(channel widths in microns)

Inverters 38 and 44: P-channel = 9.5; N-channel = 6.5
Capacitor 58: 42
Transistor 60: 22

-continued

TABLE OF SIZES
(channel widths in microns)

Transistor 62: 4
Transistors 36: 4
Transistors 17a–17k: 6
Transistors 21a–21d: 10
Transistors 21e–21l: 74 (cumulative width of the three legs)
Transistors 40: 2
Transistors 29a–29d: 10
Transistors 29e–29l: 24.5
All transistor gate lengths are one micron.
Resistors 27a–27k are each 1.5K ohms.

While FIGS. 1 and 2 and the description thereof show a particular embodiment having twelve parallel-connected P-channel transistors and twelve parallel connected N-channel transistors, the configuration may vary in accordance with the intended application. The sizes and number of transistors may vary while still using the present invention. The same is true of the peripheral circuits illustrated. While the structure as illustrated may be fabricated in accordance with well-known CMOS manufacturing techniques, it will be seen that the invention comprises a new combination of elements.

As is known, a P-channel transistor conducts between source and drain when the gate voltage is negative with respect to the source voltage. Therefore, if the source is tied to Vcc, a P-channel transistor will conduct when a "low" signal is present at its gate and will not conduct when a "high" signal is present at its gate. Conversely, an N-channel transistor will conduct between source and drain when the gate voltage is positive with respect to the source voltage. Thus, if the source voltage of an N-channel transistor is tied to ground, it will conduct when a "high" signal is present at its gate and not conduct when a "low" signal is present at its gate. A transistor is "turned-on" if it is in a conducting (low impedance) state, and is "turned-off" if it is in a non-conducting (high impedance) state.

The P-channel transistor 12 is comprised of many sub-transistors 21a–l with their drains and sources connected in parallel. In the illustrated embodiment, the P-channel transistor 12 comprises twelve such sub-transistors. For example, the first sub-transistor 21a includes the source 18a, the drain 20a, and the gate 16a. The second sub-transistor 21b comprises the source 18b, the drain 20a, and the gate 16b. The last sub-transistor 21l is comprised of source 18g, drain 20f, and gate 16l. The sources of each P-channel sub-transistor 21a–l are connected in parallel to Vcc, while the drains are connected to the output 34. Similarly, the N-channel transistor 14 includes a plurality of N-channel sub-transistors 29a–l, each characterized by a source and a drain (or a drain and a source) with gates between. The sources of the N-channel sub-transistors 29a–l are connected in parallel to ground and the drains are connected in parallel to the output 34.

In operation of the circuit, assume that the input signal 37 is originally at a "high" level. The resultant low level at the outputs of inverters 38 and 44 is connected to the gates of the first sub-transistor of the P-channel transistor 12 and the N-channel 14. Coupling transistors 17a–k each have their gates connected to Vcc and each of these transistors would be turned on. The log logic level connected to the first gates of the P-channel and N-channel sub-transistors would be coupled by the coupling transistors or the coupling resistors respectively to the gates of each of the other sub-transistors comprising the P-channel and N-channel transistors. The low voltage level on these gates will ensure that the sub-transistors comprising the P-channel transistor 12 would be on, while the sub-transistors comprising the N-channel transistor 14 would be off. Under these circumstances, output 34 and output capacitance 35 would be charged to a high voltage level. Once this high level is reached there will be little current flowing through the sub-transistors comprising P-channel transistor 12. At the same time, there will be little leakage current flowing through the sub-transistors comprising N-channel transistor 14.

If the input signal 37 next is switched to a low level, the consequent inverted signal would switch off all of the P-channel sub-transistors, while each of the N-channel sub-transistors would be turned on. Thus the charge stored on the output capacitance 35 would be rapidly drained off to ground so that the output would be at the ground or low level. Heretofore, CMOS transistors have been designed to charge the entire gate substantially instantaneously, thus turning all the N-channel sub-transistors on simultaneously. This results in a surge of current from the output circuitry to the ground, which would in turn create a large voltage at the ground node due to inductance. The change of voltage at ground, which is a reference for all the other voltages in the circuit, would adversely affect the output voltages. Naturally, this problem is compounded when multiple outputs are switching simultaneously.

In the related applications previously noted, there are disclosed circuits which prevent the rush of current through the ground terminal by more gradually draining the outside circuitry capacitor 35. This is accomplished by means of a serpentine polysilicon gate which, in connection with the gate capacitance of the sub-transistors, performs as a distributed RC network. While those circuits work very well in certain applications, in other cases, notably LSI integrated circuits, it may be necessary to have a greater delay than is practically possible with these inventions. It is to this problem that the invention described herein is dedicated. In the ensuing discussion, unless specifically noted otherwise, references to the prior art or previous devices are not intended to include the inventions disclosed in the related applications previously noted.

At the instant that input 37 switches low, P-channel pull-up transistors 36 turn on, thereby rendering the gates 16b–l of P-channel sub-transistors 18b–l high and turning off these sub-transistors. Sub-transistor 18a is turned off by the inverted input voltage at the output of inverter 38. At the same time, this low level input voltage begins to turn on N-channel transistor 14. More specifically, the resultant high level at the output of inverter 44 begins to turn on transistor 29a, that is the first sub-transistor of the N-channel transistor. At the same time, this high level signal begins to couple to the gate 24b of sub-transistor 29b. This coupling is through that portion of N-well 27 which comprises a first coupling resistor connecting the gates of sub-transistors 29a and 29b. The coupling, however, is not instantaneous since there is a finite amount of capacitance between gate 24b and the substrate on which the integrated circuit is built. Thus the coupling resistor of the N-well and this capacitance form an RC network, and the step in voltage of gate 24a is coupled to the gate of transistor 29b as a gradually rising voltage. It is only after some finite period of time that this voltage increases beyond the threshold voltage of transistor 29b to begin turning it on. In like manner, the increase in voltage at gate 24b is consequently coupled by successive RC networks to the remaining sub-transistors comprising N-transistor 14.

In previous circuits the entire change from no current flow to the peak current flow required to discharge the output load represented by capacitor 35 occurred over a very short period of time. Thus the change in current, dI/dT, was very high resulting in large inductive coupling to the ground terminal. In the case of the present invention, however, any individual sub-transistor is capable of conducting only a small portion of the total current required to discharge load capacitance 35. Thus as each sub-transistor turns on, the momentary change in current, dI/dT, is only a small portion of the current change that is experienced with prior circuits. The resultant inductive coupling to the ground terminal is also relatively small so that the level of noise voltage impressed on the ground terminal is markedly decreased.

The voltage controlling circuit 45 further reduces the dI/dT factor by temporarily decreasing the voltage present at the gates of the sub-transistors 29b–l, thereby decreasing the amount of current conducted by the sub-transistors 29b–l. The operation of voltage controlling circuit 45 will be described in detail in connection with FIG. 3.

After the charge from the output circuitry capacitor 35 has been drained through ground, the current through the ground terminal will once again be practically zero. Likewise, since the P-channel transistor 12 remains turned off, no current will exist from Vcc to output 34.

At some subsequent time, input 37 would again switch from the low level to the high level for the purpose of recharging output capacitance 35. Again, this low level is inverted by inverter 38 to turn on P-channel sub-transistor 21a. At the same time, the high level input signal turns on pull-down transistors 40 which, in turn, couple a low voltage to gates 24b–l of sub-transistors 29b–l to turn off these sub-transistors. Also, the input signal after inversion by inverter 44 turns off N-channel sub-transistor 29a. The high level input signal turns off pull-up transistors 36 and frees gates 18b–l of the P-channel sub-transistors to turn on. The turn-on signal for the P-channel sub-transistors is propagated from transistor to transistor, much as in the case when the N-channel sub-transistors are turned on. In the case of the P-channel sub-transistors, however, the resistive coupling of the gates is provided by coupling transistors 17a–k. These N-channel transistors, with their gates permanently tied to the Vcc bus, will have been conducting no current immediately prior to the time when input signal 37 returns to the high level. When input 37 goes high, gate 16a of sub-transistor 18a goes low. The associated low voltage on the source of coupling transistor 17a causes this transistor to turn on thereby beginning to couple the low turn-on voltage to gate 16b of sub-transistor 18b. In like manner, the turn on signal is sequentially coupled to subsequent gates in the chain of P-channel sub-transistors. As the coupling transistors 17a–k turn on, they provide a defined amount of resistance between any adjacent pair of gates, i.e. gates 16a and 16b. It is this resistance coupled with the the gate capacitance of the driven P-channel sub-transistor that determines the RC coupling characteristic between the sub-transistors. The use of coupling transistors to provide the desired coupling resistance results in a structure that can be realized within the spatial confines imposed by many applications of interest.

Just as in the case when the N-channel transistor chain is turned on, here in the P-channel case, the turn-on signal is propagated from sub-transistor to sub-transistor in sequential fashion. As a result the P-channel sub-transistors turn on sequentially so that the dI/dT factor at any point during the sequence is far smaller than would be the case with a single P-channel transistor or if all the sub-transistors were turned on at the same time. The end result is a marked reduction of the voltage developed across the Vcc parasitic inductance.

The purpose of the pull-up transistors 35 is to turn off the sub-transistors 21b–l simultaneously. Similarly, the purpose of the pull-down transistors 40 is to turn off the sub-transistors 21b–l simultaneously. This prevents the inadvertent establishment of a direct path between Vcc and ground during the switching operation. For example, with the input 37 initially in a high state, all the sub-transistors 21a–l of the P-channel transistor 12 will be turned on. As the input signal changes from high to low, the sub-transistors 29a–l of the N-channel transistor 14 will turn on incrementally and without the pull-up transistors 36, sub-transistors 21b–l of the P-channel transistor would turn off incrementally. At some point, sub-transistors of both the P-channel transistor and the N-channel transistor would be conducting simultaneously, resulting in a short from Vcc to ground. Naturally, this would cause high currents at both the Vcc bus and ground, resulting in high power dissipation and excessive switching noise in the device.

The P-channel pull-up transistors 36 serve to turn off all of the sub-transistors 21b–l of the P-channel transistor 12 at once by applying a voltage of about Vcc to the gates 16b–l. In operation, the pull-up transistor will turn on in response to a low signal at their gates, and apply a voltage of about Vcc to the P-channel gates. Thus, in the illustrated embodiment, all the gates will be switched or discharged at essentially the same time, resulting in a fast turn-off of the P-channel sub-transistors 21b–l.

Likewise, the N-channel pull-down transistors 40 will operate to simultaneously turn off the sub-transistors 29b–l of the N-channel transistor 14 whenever a high signal is present at the input 37, preventing a possible short through the latter sub-transistors of the N-channel transistor 14 and the initial sub-transistors of the P-channel transistor 12. Pull-up and pull-down transistors are not needed in connection with sub-transistors 21a and 29a since the inverters 38 and 44 provide the high and low signals respectively required to turn off the sub-transistors.

The voltage controlling circuit 45 further reduces the dI/dT factor by temporarily decreasing the voltage present at the gates of the sub-transistors 29b–l. The operation of voltage controlling circuit 45 will be described in detail in connection with FIG. 3.

Figure 3:
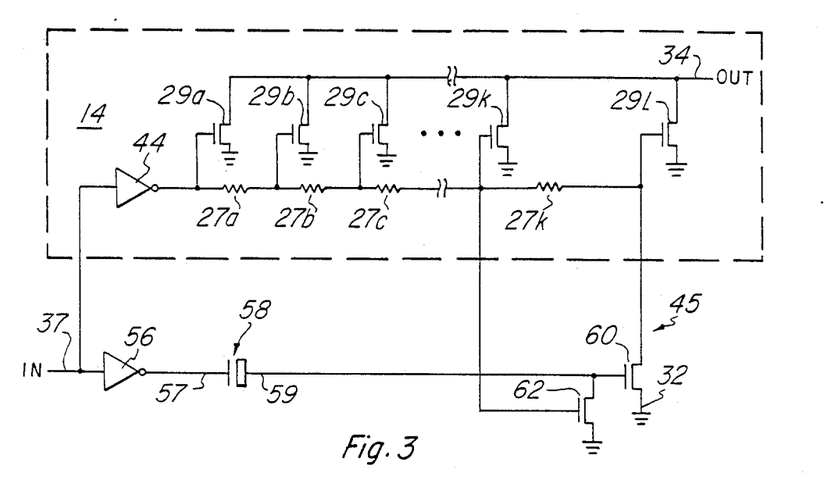
FIG. 3 illustrates a detailed circuit diagram of a circuit implemented in accordance with the present invention using an equivalent circuit representation of an output transistor.

FIG. 3 illustrates the voltage controlling circuit 45 in conjunction with an equivalent circuit representing the N-channel transistor 14. Sub-transistors 29a–l are illustrated in schematic form with their gates separated by series resistive elements 27a–k to illustrate the resistance of the corresponding portions of N-well 27. The sources of the sub-transistors 29a–l are connected to ground and the drains are connected to the output 34. The input is connected to a first inverter 44 and to a second inverter 56. The second inverter 56 is connected to a first terminal 57 of a capacitor 58, and a second terminal 59 is connected to the gate of an N-channel shunting transistor 60 and to the drain of an N-channel discharging transistor 62. The drain of the shunting transistor 60 is connected to the end of resistive element 27k which represents the end of the last resistor of N-well 27. The source of the shunting transistor 60 is connected to ground. The gate of the discharging transistor 62 is connected to gate 24k of N-channel sub-transistor 29k. While for ease of illustration, the connection is to the gate of the penultimate sub-transistor 29k, in the preferred embodiment, the gate of discharging transistor 62 is connected to the gate 24j of N-channel sub-transistor 29j. Of course, the connection can be made to other gates of the N-channel sub-transistors as desired.

Because an N-channel transistor has much higher current sinking capability than a P-channel transistor of the same size, an output pair, such as the output pair 10 illustrated in FIG. 1, can have an N-channel transistor 14 which is one-third as big as the P-channel transistor 12. Consequently, the N-channel gate capacitance may be substantially less than that of the P-channel gates. This results in an RC time constant product for the N-channel transistor chain that is less than that of the P-channel chain. The effectiveness of the graded turn-on in the N-channel devices may thus be less effective than in the case of the P-channel devices.

In operation, the voltage controlling circuit 45 limits the current sinking capability of the sub-transistors 29b–l by producing a temporary I-R drop across the coupling resistors 27a–k of N-well 27. The I-R drop provides successively lower gate voltages at each of the sub-transistors 29b–l. As will be described more fully in connection with FIG. 4, the amount of current which a transistor can conduct varies with its gate voltage.

A high to low transition of the input signal 37 causes a low to high transition of the signal present at the first gate 24a of the N-channel sub-transistors and at the first terminal 57 of the capacitor 58. As previously described, the high signal present at the sub-transistor gate propagates along the other gates and sequentially turns the sub-transistors 29a–l on. The capacitor 58 resists changes in the voltage differential between its terminals 57 and 59; therefore, it will raise the voltage at the second terminal 59 to a voltage level approximating the high signal. The high signal present on the second terminal 59 is also present at the gate of the shunting transistor 60, putting it in a conducting state. Hence, the shunting transistor 60 conducts between the last gate of the N-channel sub-transistors and ground causing a current through the coupling resistor elements of N-well 27.

A current through the coupling resistors of N-well 27 creates a voltage drop over each of the resistors 27a–k. Therefore, each sub-transistor has a gate voltage which is less than the sub-transistor preceding it. Since the first sub-transistor 29a would be fully turned on, it would tend to sink more current than the last sub-transistor 29l, which would conduct relatively little current. By limiting the current through the sub-transistors 29b–l, the rate at which current is changing at the ground node is reduced.

While it is desirable to limit the current sinking capability of the sub-transistors 29b–l at the beginning of the output voltage transition, it is also necessary that the N-channel transistor 14 eventually be able to sink current at its maximum capability in order to maintain rated output current drive capacity. Therefore, it is beneficial to inhibit current through the coupling resistors 27a–k after a predetermined time interval. The purpose of the discharging transistor 62 is to discharge the capacitor 58 by providing a path to ground. Discharging transistor 62 has its gate connected to gate 24k of N-channel sub-transistor 29k, and is therefore in a conduction state only when the proper signal is present on this sub-transistor gate. Thus, by positioning the gate of the discharging capacitor 62 at the gate of N-channel sub-transistor 29k or at other gates in this sub-transistor chain, the time at which discharge transistor 62 turns on, and the strength with which it turns on may be varied. After the discharging transistor 62 turns on, it bleeds the charge off of capacitor 58, thereby reducing the voltage present at the gate of the shunting transistor 60; consequently, the amount of current which the shunting transistor 60 can conduct is reduced, and the amount of current flowing through the coupling resistors 27a–k is also reduced. The reduction in current flowing through these resistors causes a proportional reduction in the voltage drop across the resistors. The reduction in the voltage drop across the coupling resistors 27a–k increases the gate voltage at each of the sub-transistors 29b–l allowing the sub-transistors 29b–l to conduct more current.

The discharging transistor 62 continues to bleed the charge off the capacitor 58 until a near zero voltage is present at the gate of the shunting transistor 60. As the voltage at the gate of the shunting transistor 60 declines, the voltage at the gates of the sub-transistors 29b–l increases; at the point where the shunting transistor 60 is no longer conducting, the voltages at the gates of sub-transistors 29b–l will be equal to the voltage present at the first gate 24a.

In the current invention, the gate of the discharging transistor 62 is connected to one of the gates of the N-channel sub-transistors; thus, the time of discharge may be adjusted by moving the connection of the gate of the discharging transistor 62 from one gate to another of the sub-transistors. By placing the gate of discharging capacitor 62 towards the input end of the sub-transistor chain, the discharging transistor 62 will turn on earlier and more strongly than if the gate of the discharging transistor 62 is placed further along the series of sub-transistors. By placing the gate towards the output end of the series, the duration of the I-R drop can be increased while decreasing the size of capacitor 58 thereby providing a smoother current transition while using less space on the integrated circuit.

In the preferred embodiment, the capacitor 58 is formed by connecting the source and drain of an N-channel transistor to form one terminal, with the polysilicon gate used as the other terminal. However, other methods of forming a capacitive element on an integrated circuit are known to those skilled in the art.

Figure 4:
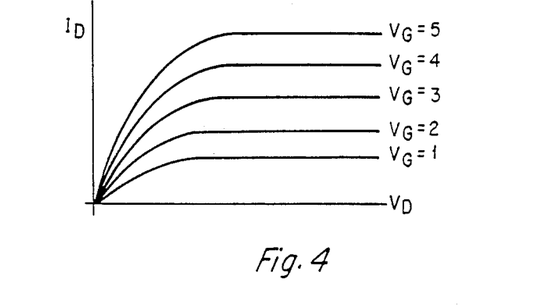
FIG. 4 illustrates output characteristic curves for a representative transistor.

FIG. 4 illustrates output characteristic curves for a typical transistor. As can be seen from the curves, the drain current Id (amount of current which the transistor will conduct) for a given drain voltage Vd increases substantially proportionally with the voltage present at the gate Vg. It is this characteristic of a transistor which allows the present invention to provide a smooth current transition in response to a changing output by proportionately decreasing the gate voltage of successive sub-transistors 29a–l in the N-channel transistor 14. This characteristic also accounts for a decrease in current through the resistors 27a–k in response to decreasing the signal present on the gate of the shunting transistor 60.

It should also be noted that while the invention has been illustrated in FIG. 3 with an N-channel transistor, it could be easily modified to reduce the sharp transition of current in a P-channel, bi-polar NMOS, or other transistor, by methods known to those skilled in the art.

Thus, the present invention provides advantages as discussed above, as well as numerous other advantages. As will be apparent to those skilled in the art, the present invention can be widely modified and varied. The scope of the invention is not limited, except as set forth in the accompanying claims.

What is claimed is:

1. An integrated circuit structure comprising:
    a substrate having semiconductor areas forming a plurality of sub-transistors, each of said sub-transistors having a discrete gate, and
    at least one pair of said sub-transistors having the gates of the two sub-transistors of the pair coupled through a source-to-drain current path of a coupling transistor to form a series circuit so that a gate signal applied to the gate of a first sub-transistor of said series circuit propagates to the gate of a subsequent sub-transistor in said circuit in a predetermined time interval, the propagation of said gate signal along said series circuit causing sequential conduction of ones of said sub-transistors.

2. The integrated circuit structure of claim 1, further comprising at least one turn-off transistor, each of said turn-off transistors having its drain connected to the gate of one of the sub-transistors in said series circuit, such that all of the sub-transistors in said series circuit are substantially simultaneously rendered non-conductive in response to a signal applied to said turn-off transistors.

3. The integrated circuit structure of claim 1 wherein at least one of said sub-transistors has a channel dimension different than that of the other sub-transistors.

4. An integrated circuit structure comprising:
    a substrate having semiconductor areas forming a plurality of sub-transistors, each of said sub-transistors having a discrete gate, and
    resistance means comprising a doped region near the surface of said substrate, said resistance means serving to couple the gates of at least one pair of said sub-transistors in a series circuit so that a gate signal applied to a gate of a first sub-transistor of said series circuit propagates to the gates of consecutive sub-transistors in said circuit in a predetermined time interval, the propagation of said gate signal along said series circuit causing sequential conduction of ones of said sub-transistors.

5. The integrated circuit structure of claim 4, further comprising at least one turn-off transistor, each of said turn-off transistors having its drain connected to the gate of one of the sub-transistors in said series circuit, such that all of the sub-transistors in said series circuit are substantially simultaneously rendered non-conductive in response to a signal applied to said turn-off transistors.

6. The integrated circuit structure of claim 5, wherein at least one of said sub-transistors has a channel dimension different than that of the other sub-transistors.

7. An integrated circuit structure comprising:
    a substrate having semiconductor surface areas forming a plurality of sub-transistors, each of said sub-transistors having a discrete gate,
    resistance means intermediate pairs of said sub-transistors to couple the gates of at least some of said sub-transistors in a series circuit so that a gate signal applied to the gate of a first sub-transistor of said series circuit propogates to the gates of consecutive sub-transistors in said circuit in a predetermined time interval, the propagation of said gate signal along said series circuit causing conduction of ones of said sub-transistors; and
    a conducting device connected to a point in said series circuit remote from the gate of said first sub-transistor to allow a transient current to pass from said gate of said first sub-transistor through at least a portion of said resistance means to cause a voltage drop across said portion, said voltage drop reducing the amount of current conducted by ones of said sub-transistors.

8. The integrated circuit structure of claim 7 wherein said resistance means comprises at least one resistor.

9. The integrated circuit structure of claim 8 wherein said resistor is formed near the surface of said substrate.

10. The integrated circuit structure of claim 7 wherein said resistance means comprises at least one transistor.

11. The integrated circuit structure of claim 7 wherein at least one of said sub-transistors has a channel dimension different than that of the other sub-transistors.

12. The integrated circuit structure of claim 7 and further comprising:
    a switching device connected to said conducting device operable to inhibit or enable current through said conducting device.

13. The integrated circuit structure of claim 12 wherein said switching device comprises:
    a capacitor having first and second terminals, said capacitor connected to said conducting device such that said conducting device will conduct in response to a change in said signal on said first terminal.

14. The integrated circuit structure of claim 13 wherein said switching device further comprises a restoring device, said restoring device operable to restore a predetermined voltage on said second terminal after a second predetermined time interval such that current flow through said conducting device will be inhibited when said predetermined voltage is present on said second terminal.

15. The integrated circuit structure of claim 14 wherein said restoring device is a transistor having a source connected to a second predetermined voltage and a drain connected to said second terminal.

16. The integrated circuit structure of claim 15 wherein the gate of said restoring device is connected to a point in said series circuit remote from the gate of said first transistor.

17. The integrated circuit structure of claim 12 wherein said switching device comprises:
    a capacitor having first and second terminals, said second terminal connected to said conducting device such that said conducting device will conduct in response to a change in a signal on said first terminal; and
    an inhibiting device connected to a point in said series circuit remote from the gate of said first transistor such that said conducting device is gradually rendered non-conductive a predetermined time after said inhibiting device senses a voltae change on said point in said series circuit.

18. The integrated circuit structure of claim 17 wherein said inhibiting device comprises a transistor having a source connected to a predetermined voltage and its gate connected to said point in said series circuit.

19. An integrated circuit structure comprising:
a substrate having semiconductor areas forming a first plurality of sub-transistors, each of said sub-transistors having a discrete gate,
a plurality of coupling transistors, each coupling transistor having a source to drain current path, said source to drain current path being connected between the gates of two of said first plurality of sub-transistors so that a turn-on gate signal applied to the first gate of said first plurality of sub-transistors is propagated over a period of time by said coupling transistors to the gates of others of said first plurality of sub-transistors, ones of said first plurality of sub-transistors turning on at different times to prevent the large rate of change in power supply current that would be required if all the transistors of said first plurality turned on at the same time.

20. The integrated circuit structure of claim 19 further comprising a plurality of turn-off transistors, each of said turn-off transistors having its source to drain current path connected between a reference voltage and a gate of one of said first plurality of transistors, the gates of said turn-off transistors being connected to and responsive to a switching voltage to simultaneously render said first plurality of transistors non-conductive.

21. The integrated circuit structure of claim 19 wherein said coupling transistors are biased so as to turn on sequentially in response to said turn-on gate signal.

22. The integrated circuit structure of claim 19 wherein at least one of said sub-transistors has a channel dimension different than that of the other sub-transistors.

23. The integrated circuit structure of claim 19 further comprising:
a second plurality of sub-transistors, each of said sub-transistors having a discrete gate; and,
a plurality of resistance means for coupling the gates of at least one pair of said second sub-transistors in a series circuit.

* * * * *